(12) United States Patent
Reynolds

(10) Patent No.: US 11,003,291 B2
(45) Date of Patent: May 11, 2021

(54) SEMICONDUCTOR DEVICE HAVING A COMMUNICATION BUS

(71) Applicant: SYNAPTICS INCORPORATED, San Jose, CA (US)

(72) Inventor: Joseph Kurth Reynolds, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/551,139

(22) Filed: Aug. 26, 2019

(65) Prior Publication Data

US 2021/0064183 A1    Mar. 4, 2021

(51) Int. Cl.
*G06F 3/044* (2006.01)
*G06F 3/041* (2006.01)
*H01L 23/528* (2006.01)
*H01L 23/522* (2006.01)

(52) U.S. Cl.
CPC .......... *G06F 3/0443* (2019.05); *G06F 3/0412* (2013.01); *G06F 3/0447* (2019.05); *H01L 23/528* (2013.01); *H01L 23/5222* (2013.01)

(58) Field of Classification Search
USPC ................................................ 345/170–178
See application file for complete search history.

(56) References Cited

U.S. PATENT DOCUMENTS

| | | | | |
|---|---|---|---|---|
| 9,153,159 | B2* | 10/2015 | Suh | G09G 5/001 |
| 2004/0125087 | A1* | 7/2004 | Taylor | G06F 3/044 |
| | | | | 345/173 |
| 2006/0145059 | A1* | 7/2006 | Lee | H04R 23/00 |
| | | | | 250/214 R |
| 2006/0152460 | A1* | 7/2006 | Toyozawa | G09G 3/3677 |
| | | | | 345/98 |
| 2011/0164013 | A1* | 7/2011 | Nakagawa | G02F 1/13338 |
| | | | | 345/207 |
| 2011/0267305 | A1* | 11/2011 | Shahparnia | G06F 3/0412 |
| | | | | 345/174 |
| 2017/0160835 | A1* | 6/2017 | Zenker | G06F 3/0412 |
| 2020/0142521 | A1* | 5/2020 | Van Ostrand | G06F 3/045 |

* cited by examiner

*Primary Examiner* — Tony O Davis
(74) *Attorney, Agent, or Firm* — Leydig, Voit & Mayer, Ltd.

(57) ABSTRACT

A semiconductor device for an input device comprises a die body comprising sensor circuitry, a plurality of pads and a sensor bus. The sensor circuitry is configured to operate a plurality of sensor electrodes disposed in a single layer for capacitive sensing. A first pad of the plurality of pads is configured to be coupled to a first sensor electrode of the plurality of sensor electrodes, a second pad of the plurality of pads is configured to be coupled to a second sensor electrode of the plurality of sensor electrodes, and a third pad of the plurality of pads is configured to be coupled to a third sensor electrode of the plurality of sensor electrodes. The sensor bus comprises a plurality of wires. A first wire of the plurality of wires is configured to couple the first pad and the second pad to a first transmitter of the sensor circuitry and a second wire of the plurality of wires is coupled to the third pad to a first receiver of the sensor circuitry.

21 Claims, 16 Drawing Sheets

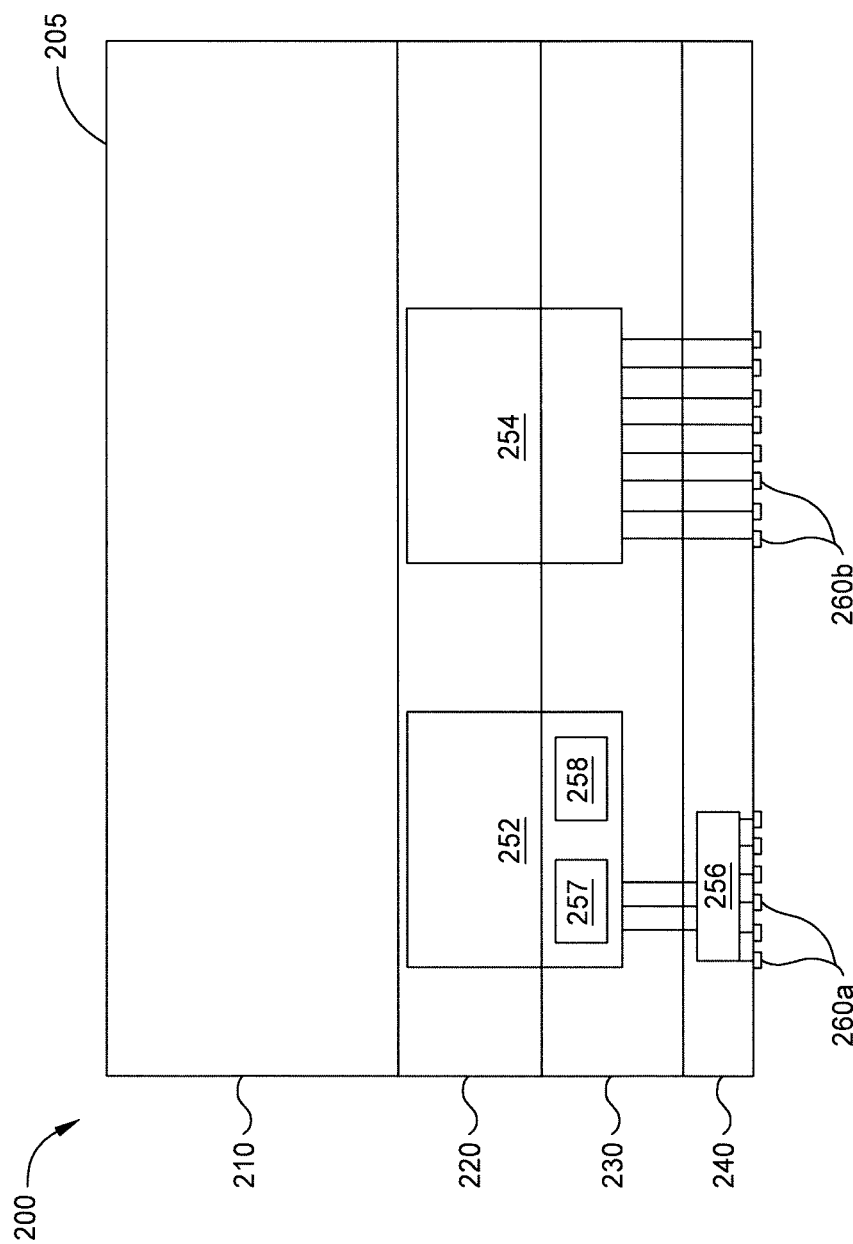

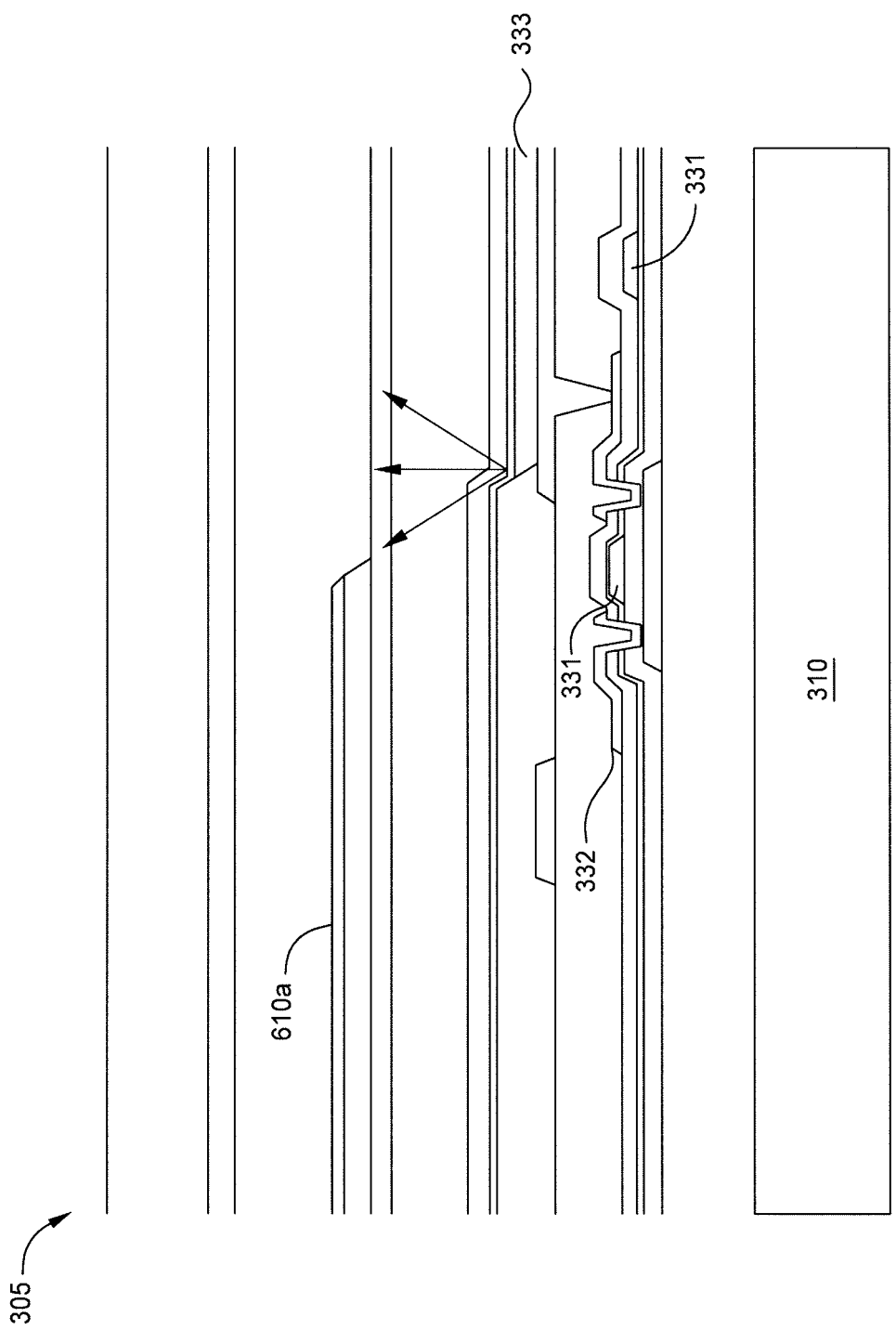

SEMICONDUCTOR DEVICE HAVING A COMMUNICATION BUS

BACKGROUND

Field

The disclosure herein is generally related to electronic devices, and more specifically, to capacitive sensing devices.

Description of the Related Art

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchscreens integrated in, or peripheral to, notebook or desktop computers. Proximity sensor devices may also often be used in smaller computing systems, such as touch screens integrated in cellular phones.

SUMMARY

In one embodiment, a semiconductor device comprises a die body comprising sensor circuitry, a plurality of pads and a sensor bus. The sensor circuitry is configured to operate a plurality of sensor electrodes disposed in a single layer for capacitive sensing. A first pad of the plurality of pads is configured to be coupled to a first sensor electrode of the plurality of sensor electrodes, a second pad of the plurality of pads is configured to be coupled to a second sensor electrode of the plurality of sensor electrodes, and a third pad of the plurality of pads is configured to be coupled to a third sensor electrode of the plurality of sensor electrodes. The sensor bus comprises a plurality of wires. A first wire of the plurality of wires is configured to couple the first pad and the second pad to a first transmitter of the sensor circuitry and a second wire of the plurality of wires is coupled to the third pad to a first receiver of the sensor circuitry.

In one embodiment, an input device comprises a plurality of sensor electrodes and a semiconductor device. The plurality of sensor electrodes is disposed in a common layer. The semiconductor device comprising sensor circuitry, a plurality of pads and a sensor bus. The sensor circuitry is configured to operate the plurality of sensor electrodes disposed in a single layer for capacitive sensing. A first pad of the plurality of pads is configured to be coupled to a first sensor electrode of the plurality of sensor electrodes, a second pad of the plurality of pads is configured to be coupled to a second sensor electrode of the plurality of sensor electrodes, and a third pad of the plurality of pads is configured to be coupled to a third sensor electrode of the plurality of sensor electrodes. The sensor bus comprises a plurality of wires. A first wire of the plurality of wires is configured to couple the first pad and the second pad to a first transmitter of the sensor circuitry and a second wire of the plurality of wires is coupled to the third pad to a first receiver of the sensor circuitry.

In one embodiment, a method for capacitive sensing comprises driving, with a first transmitter, a first sensor electrode and a second sensor electrode with a first transmitter signal. The first sensor electrode is coupled to a first pad of a semiconductor device and the second sensor electrode is coupled to a second pad of the semiconductor device. Further, the first pad and the second pad are coupled to a first wire of a sensor bus of the semiconductor device and the first wire is coupled to the first transmitter. The method further comprises receiving, with a first receiver, a first resulting signal with a third sensor electrode coupled to a third pad of the semiconductor device. The third pad is coupled to a second wire of the sensor bus, and the second wire is coupled to the first receiver. Additionally, the method comprises determining positional information for an input object based on a measurement of a change in capacitive coupling between at least one of the first sensor electrode and the second sensor electrode and the third sensor electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIGS. 2A-2B are schematic block diagrams of example semiconductor devices, according to one or more embodiments.

FIG. 8B illustrates is a cross-sectional view of a portion of a display panel, according to one or more embodiments.

Figure 1:
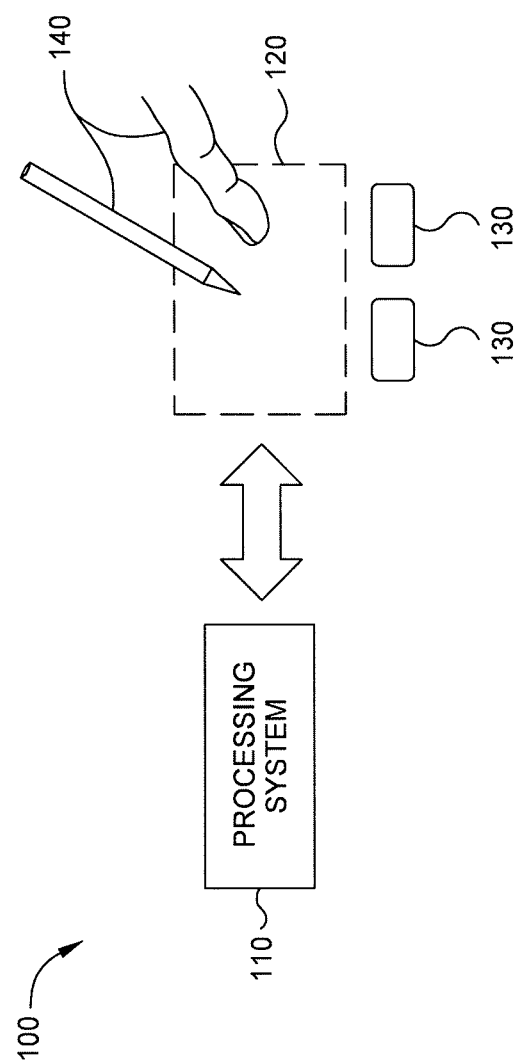
FIG. 1 illustrates an example input device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

An example input device 100 as shown in FIG. 1 in accordance with embodiments of the disclosure may be configured to provide input to an electronic system (not shown). As used in this document, the term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, personal digital assistants (PDAs) and multi-media entertainment devices of automobiles. Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device.

The input device 100 can be implemented as a physical part of the electronic system, or can be physically separate from the electronic system. In one embodiment, the electronic system may be referred to as a host device. As appropriate, the input device 100 may communicate with parts of the electronic system using any one or more of the following: buses, networks, and other wired or wireless interconnections. Examples include I$^2$C, SPI, PS/2, Universal Serial Bus (USB), MIPI, DisplayPort, Bluetooth, RF, and IRDA.

In FIG. 1, the input device 100 is shown as a proximity sensor device configured to sense input provided by one or more input objects 140 in a sensing region 120. Example input objects 140 include fingers and styli, as shown in FIG. 1. An exemplary proximity sensor device may be a touchpad, a touch screen, a touch sensor device and the like.

The sensing region 120 encompasses any space above, around, in and/or near the input device 100 in which the input device 100 is able to detect user input, e.g., user input provided by one or more input objects 140. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input that comprises: no contact with any surfaces of the input device 100; contact with an input surface, e.g., a touch surface, of the input device 100: contact with an input surface of the input device 100 coupled with some amount of applied force or pressure; and/or a combination thereof. In various embodiments, input surfaces may be provided by surfaces of casings within which the sensor electrodes (also referred to herein as sensing electrodes) reside, by face sheets applied over the sensor electrodes or any casings, etc. In some embodiments, the sensing region 120 has a rectangular shape when projected onto an input surface of the input device 100. An input object that is not in contact with any surfaces of the input device 100 may be referred to as a hovering input object.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images (e.g., of capacitive signals) that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self-capacitance" (also often referred to as "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. In some implementations sensing elements may be formed of a substantially transparent metal mesh (e.g., a reflective or absorbing metallic film patterned to minimize visible transmission loss from the display sub-pixels) within the visible active area of the display. Further, the sensor electrodes may be disposed over a display of a display device. The sensing electrodes may be formed on a common substrate of a display device (e.g., on the encapsulation layer of a rigid or flexible organic light emitting diode (OLED) display). An additional dielectric layer with vias for a jumper layer may also be formed of an additional substantially transparent metal mesh material (e.g., between the user input and an OLED cathode). The jumpers of the jumper layer may be coupled to the electrodes of a first group and cross over sensor electrodes of a second group (e.g. in a two layer sensor where one group of sensor electrodes is arrayed substantially orthogonal to a second group of sensor electrodes. In another single layer sensor routing implementation any jumper layer does not connect to a via in the active area of the display.

Some capacitive implementations utilize "mutual capacitance" (also often referred to as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also referred to herein as "transmitter electrodes" or "transmitters") and one or more receiver sensor electrodes (also referred to herein as "receiver electrodes" or "receivers"). The coupling may be reduced when an input object coupled to a system ground approaches the sensor electrodes. Transmitter sensor electrodes may be modulated relative to a reference voltage, e.g., system ground, to transmit transcapacitive sensing signals. Receiver sensor electrodes may be held substantially constant relative to the reference voltage or modulated relative to the transmitter sensor electrodes to facilitate receipt of resulting signals. A resulting signal may comprise effect(s) corresponding to one or more transcapacitive sensing signals, and/or to one or more sources of environmental interference, e.g., other electromagnetic signals. Sensor electrodes may be dedicated transmitters or receivers, or may be configured to both transmit and receive.

Figure 3A:
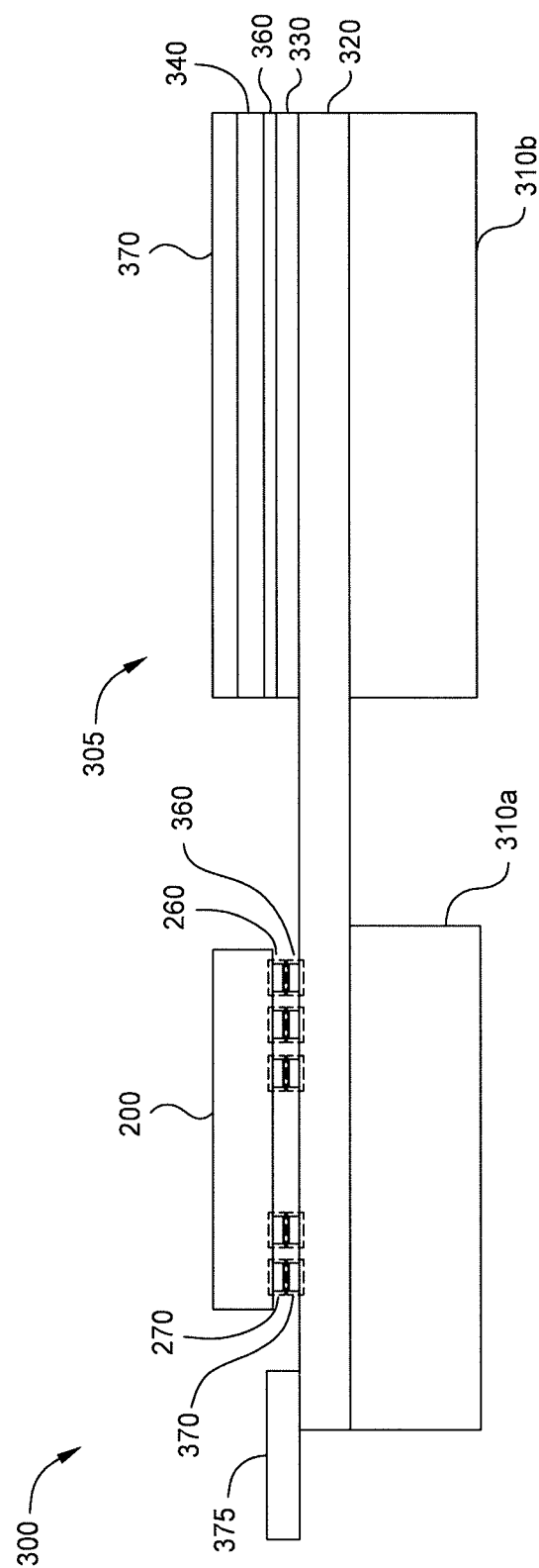
FIGS. 3A-3D are schematic block diagrams of example input devices, according to one or more embodiments.
Figure 3B:
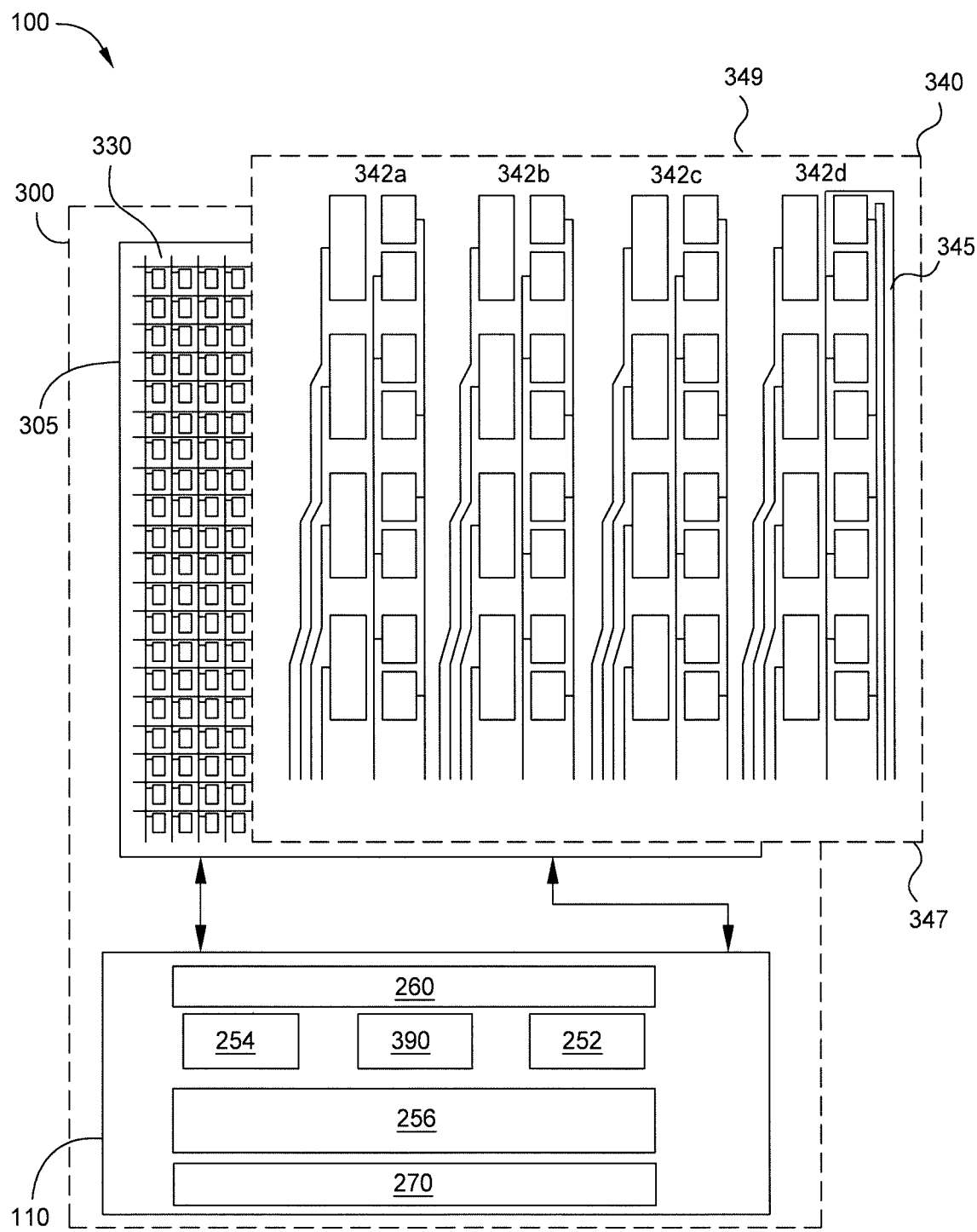
Figure 3C:
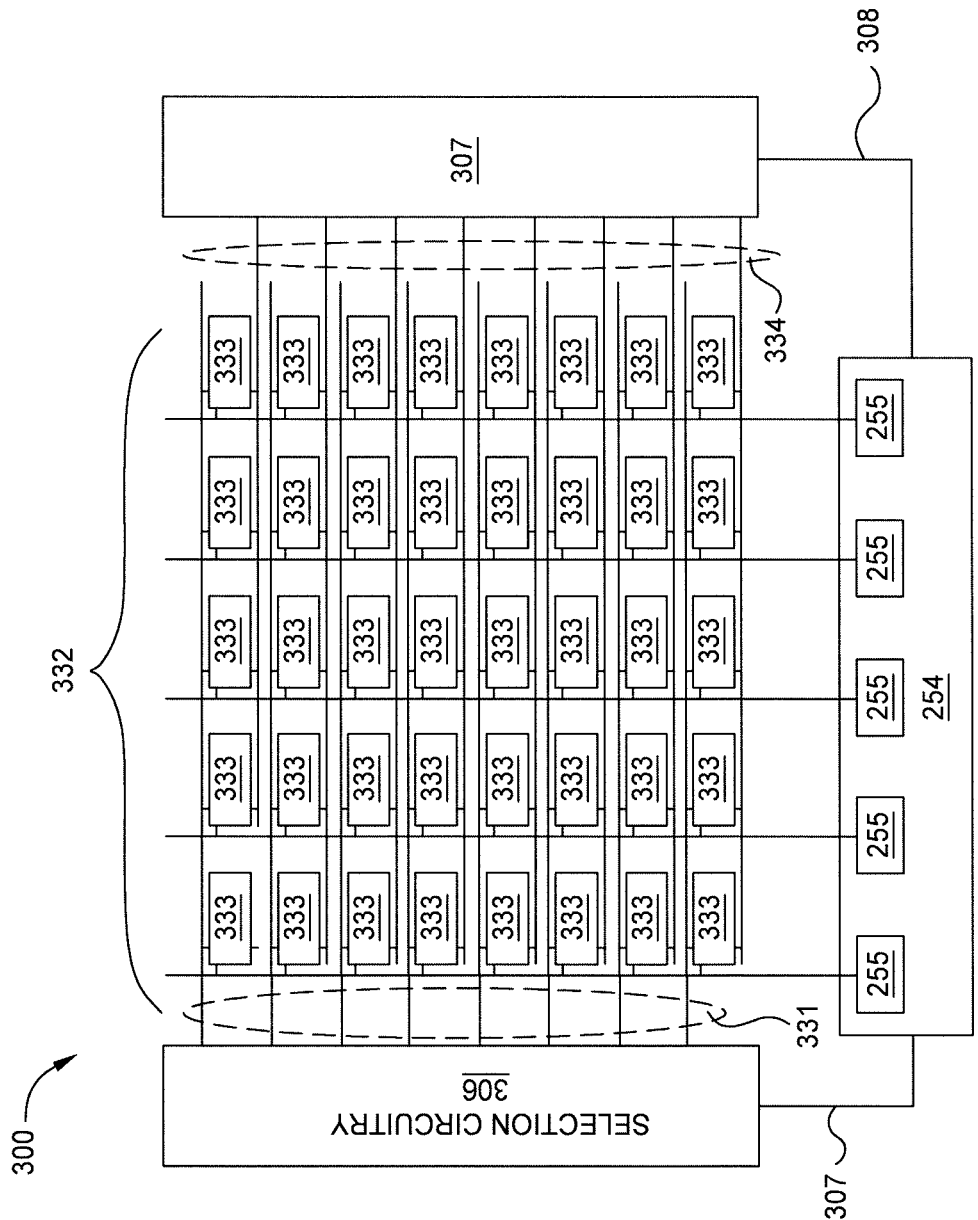

In one or more embodiments, a group of transmitter electrodes may be arrayed substantially parallel (e.g. with the data lines 322 of FIG. 3C) while a group of receiver electrodes are arrayed parallel to each other, but orthogonal to the first group (e.g. parallel with gate lines 331 of FIG. 3C). In some embodiments, one or more transmitter or receiver electrodes may be "double routed" by connecting both ends of the sensor electrode (e.g. near end and far end) by a route external to the display active area so as to reduce the effective resistance of the electrode and improve response time of the sensor electrode.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) chips and/or other circuitry components. For example, a processing system for a mutual capacitance sensor device may comprise transmitter circuitry, e.g., transmitter circuitry 257 of FIG. 2A, configured to transmit signals with transmitter sensor electrodes, and/or receiver circuitry, e.g., receiver circuitry 258, configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (in another embodiment, with associated firmware) separate from the central processing unit. As another example, the input device 100 may be physically integrated in a phone, and the processing system 110 may comprise circuits and firmware that are part of a main processor (e.g., a mobile device application processor or any other central processing unit) of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system, e.g., to a central processing system of the electronic system that is separate from the processing system 110, if such a separate central processing system exists. In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. The filtering may comprise one or more of demodulating, sampling, weighting, and accumulating of analog or digitally converted signals (e.g., for FIR digital or IIR switched capacitor filtering) at appropriate sensing times. The sensing times may be relative to (e.g. phase synchronous with or time sequential with) the display output periods (e.g., display line update periods or blanking periods). As yet another example, the processing system 110 may subtract or otherwise account for a baseline, such that the information reflects a difference between the electrical signals from user input and the baseline signals. A baseline may account for display update signals (e.g., subpixel data signal, gate select and deselect signal, or emission control signal) which are spatially filtered (e.g., demodulated and accumulated) and removed from the lower spatial frequency sensing baseline. Further, a baseline may compensate for a capacitive coupling between the sensor electrodes and one or more nearby electrodes. The nearby electrodes may be display electrodes, dummy sensor electrodes, and or other conductive objects that may be capacitively coupled with the sensor electrodes. Additionally, the baseline may be compensated for using digital or analog means. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may comprise substantially transparent sensor electrodes overlaying the display screen and provide a touch screen interface for the associated electronic system. The display panel may be any type of dynamic display capable of displaying a visual interface to a user, and may include any type of light emitting diode (LED), OLED, liquid crystal display (LCD), plasma, electroluminescence (EL), or other display technology. The input device 100 and the display panel may share physical elements. For example, some embodiments may utilize some of the same electrical components for displaying and sensing. As another example, the display panel may be operated in part or in total by the processing system 110.

It should be understood that while many embodiments of the disclosure are described in the context of a fully functioning apparatus, the mechanisms of the present disclosure are capable of being distributed as a program product, e.g., software, in a variety of forms. For example, the mechanisms of the present disclosure may be implemented and distributed as a software program on information bearing media that are readable by electronic processors, e.g., non-transitory computer-readable and/or recordable/writable information bearing media readable by the processing system 110. Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

In one or more embodiments, the processing system 110 may be configured for display updating and capacitive sensing. For example, the processing system 110 may include display driver circuitry, e.g., display circuitry 254 of FIG. 2A, configured to drive one or more display electrodes for display updating and sensor circuitry, e.g., sensor circuitry 252 of FIG. 2A, configured to operate one or more sensor electrodes for capacitive sensing. Alternatively, the processing system 110 may be configured for one of display updating and capacitive sensing. For example, the processing system 110 may include display driver circuitry, e.g., display circuitry 254 of FIG. 2A, configured to drive one or more display electrodes for display updating or sensor circuitry, e.g., sensor circuitry 252 of FIG. 2A, configured to operate one or more sensor electrodes for capacitive sensing.

FIG. 2A illustrates schematic cross-sectional view of a semiconductor device 200, according to one or more embodiments. In one or more embodiments, the semiconductor device 200 is the semiconductor device of the processing system 110. The semiconductor device 200 includes die body 205 and the die body 205 includes one or more of a substrate 210, a front-end-of-line (FEOL) portion 220, a back-end-of-line (BEOL) portion 230, and an interconnect layer 240. The interconnect layer 240 includes one or more of a redistribution layer (RDL) and one or more metal layers. The one or more metal layers may be disposed between the BEOL portion 230 and the RDL. The FEOL portion 220 may include transistors, capacitors, and/or resistors, among others, of the semiconductor device 200. Further, the BEOL portion 230 may include the interconnections between the transistors, capacitors and/or resistors of the FEOL portion 220. The RDL includes one or more metal layers including pads 260 and interconnects between the pads 260 and the BEOL portion 230.

In one or more embodiments, the sensor circuitry 252 is included within the FEOL portion 220 and the BEOL portion 230. Further, the display circuitry 254 may be included within the FEOL portion 220 and the BEOL portion 230.

The semiconductor device 200 may additionally include a sensor bus 256. The sensor bus 256 may include one or more communication wires disposed within the interconnect layer 240. In one embodiment, a first portion of the sensor bus 256 is disposed within a first portion of the interconnect layer 240 and a second portion of the sensor bus is disposed within a second portion of the interconnect layer 240. The first portion of the interconnect layer 240 may correspond to the RDL and the second portion of the interconnect layer 240 may correspond to one or more metal layers. Alternatively, the sensor bus 256 may be disposed within the RDL or in the one or more metal layers. Further, in one or more embodiments, the sensor bus 256 may be disposed in the BEOL portion 230, or partially within the BEOL portion 230 and interconnect layer 240. The sensor bus 256 couples the sensor circuitry 252 to a portion of the pads 260, e.g., the pads 260a. Further, in embodiments including the display circuitry 254, the display circuitry 254 is coupled to the pads 260b of pads 260.

Figure 2B:
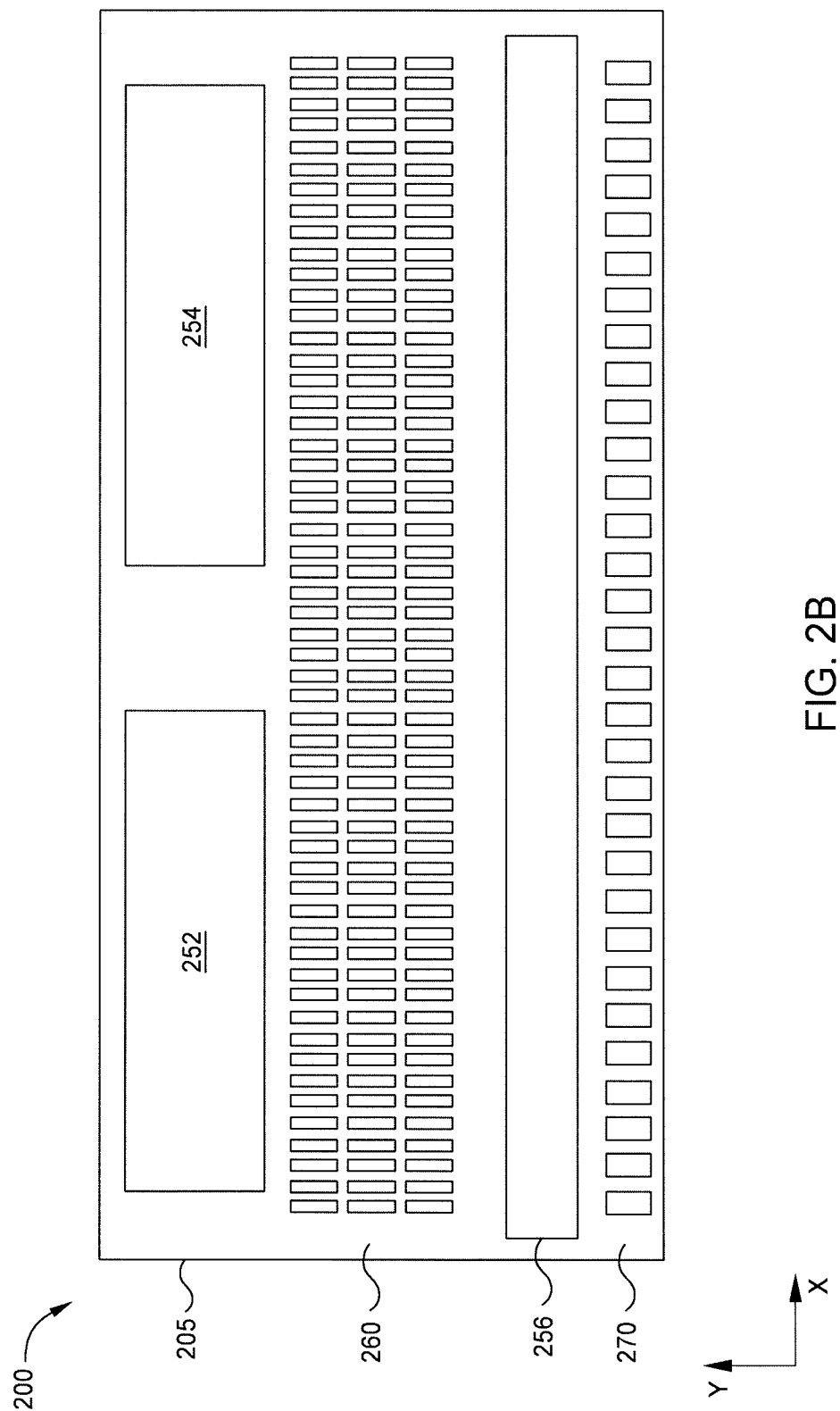

FIG. 2B is a top schematic view of the semiconductor device 200, according to one or more embodiments. In the embodiment of FIG. 2B, the elements are illustrated as being in a common layer for ease of illustration. However, in various embodiments, the sensor circuitry 252, the display circuitry 254, the pads 260, the sensor bus 256, and the pads 270 may be disposed in various different layers as illustrated in FIG. 2A. The pads 260 may be referred to as output pads as sensing signals are transmitted from the sensor circuitry 252 via one or more the pads 260 onto one or more sensor electrodes. Further, one or more of the pads 260 may be configured to output display update signals and/or display control signals onto display electrodes driven by the display circuitry 254. In one or more embodiments, the pads 270 are configured to receive data and control signals from a host device.

In various embodiments, the sensor bus 256 may be positioned between the pads 260 and the pads 270. For example, the sensor bus 256 may be disposed in a different layer from the pads 260 and the pads 270, and positioned between the pads 260 and the pads 270 in the Y direction. The pads may be composed of Au (Gold) or Cu (Copper) bumps used to connect other substrates such as COF (Chip on Film), COG (Chip on Glass), or COP (Chip on Plastic) using ACF (Anisotropic Conductive Film) eutectic bonds or other conductive contacts to the display.

In one or more embodiments, the pads 260, 270 couple the semiconductor device 200 to an electronic device. For example, with reference to FIG. 3A, the pads 260, 270 may be coupled to pads 360, 370, respectively, of the display device 300. The pads 360, 370 may be disposed on the substrate 310 of the display device 300. Further, the pads 360 are coupled to one or more metal layers 320 on the substrate 310 which are coupled display electrodes 330 and/or sensor electrodes 340. The metal layers 320 may include one or more traces which couple the pads 360 with the display electrodes 330 and/or the sensor electrodes 340. In one embodiment, a polarizer is disposed over at least one of the display electrodes 330 and the sensor electrodes 340. Further, in one or more embodiments, an encapsulation layer may be disposed between the sensor electrodes 340 and the display electrodes 350 within the active area of the display device 300. The active area of the display device 300 corresponds to an area of the display device 300 where an image is displayed and updated.

In one embodiment, a flexible connector 375 is coupled to the substrate 310 of the display device 300. The flexible connector 375 may be coupled to a host device and is configured to communicatively couple the semiconductor device 200 with the host device. For example, the flexible connector 375 may carry signals from the host device to the semiconductor device 200 via the pads 270, 370 and from the semiconductor device 200 to the host device via the pads 270, 370. In one embodiment, the flexible connector 375 is configured to carry display data signals from the host device to the semiconductor device 200 and carry output signals, e.g., positional information of an input object, status signals, etc., from the semiconductor device 200 to the host device. In one embodiment, the portion of the substrate 310b and the semiconductor device 200 may be folded under the portion of the substrate 310a and the display panel 305. In various embodiment, the semiconductor device 200 may be disposed on a flexible substrate, e.g., a flexible connector, which is then coupled to the substrate 310b of the display panel 305.

FIG. 3B is a top view of a schematic of the input device 100, according to one or more embodiments. As is illustrated, the input device 100 includes the display device 300 and the display device 300 includes the processing system 110, the display panel 305 and sensor electrodes 340. The sensor electrodes 340 for a capacitive sensor routed in single layer may be arranged in columns (e.g. 342a, 342b, 342c, 342d) such that the transmitter electrodes of each row on multiple columns are conductively coupled and driven by the same sensing circuitry on the processing system 110 but through separate output pads. In one embodiment, the edge 347 of the sensing region (e.g., the edge closest to the processing system 110) may contain the majority of routing. In one or more embodiments, the edge 349 of the sensing region may also be used for additional routing. In some cases one or more of the electrodes may be "double routed" by an edge route (e.g. 345) to minimize resistance and response time. The display panel 305 is communicatively coupled to the processing system 110 and comprises display electrodes 330. In one or more embodiments, the display electrodes 330 include one or more of gate lines, data lines, e.g., data lines, subpixel electrodes, emission control lines, and a cathode electrode, among others. Further, the input device 100 includes the sensor electrodes 340 are coupled to the processing system 110 and include one or more sensor electrodes.

In one or more embodiments, a sensor bus on an integrated circuit (IC) chip configured for the proximity sensor reduces routing on a corresponding display substrate by coupling multiple output pads of the IC chip to a single bus line at a finer pitch than allowed on the display substrate. The reduced routing may improve industrial design and reduce cost by minimizing the distance between the active area of the display device, the routing for sensor electrodes and the proximity sensor, and the IC chip.

In one or more embodiments, the processing system 110 may include the sensor circuitry 252, the display circuitry 254 and a determination module 390. The determination module 390 may determine one or more measurements of change in capacitance of the sensor electrodes 340. The determination module 390 may further determine positional information for an input object 140. In one embodiment, the determination module 390 receives processed or unprocessed resulting signals from the sensor circuitry 252, determines one or more measurements of change in capacitance between the sensor electrodes 340, and determines positional information for one or more input objects, e.g., the input object 140, from the one or more measurements of change in capacitance. In various embodiments, determining the positional information comprises determining a capacitive image from the one or more measurements of change in capacitance and determining the positional information from the capacitive image.

In one embodiment, display device 300 may be organic light emitting diode (OLED) display comprising a plurality of subpixels. Each subpixel includes display circuitry, and is coupled to a data line (may also be referred to as a source electrode, data line or a data electrode), a gate line (may also be referred to as a gate electrode or a line selection electrode), and, in some embodiments, an emission control line (may also be referred to as an emission control electrode). The display circuitry, the data line and the gate line that are configured to control updating of each of the subpixels.

For example, FIG. 3C is a schematic top view of a portion of display device 300 where each subpixel 333 is coupled to a gate line 331 and a data line 332. In one embodiment, selection circuitry 324 is configured to drive gate select and gate deselect signals on to the gate lines 331 to select (active) and deselect (deactivate) the subpixels 333 for updating. The gate select signal may be referred to a gate high signal or $V_{GH}$ and the gate deselect signal may be referred to a gate low signal or $V_{GL}$. In one embodiment, $V_{GH}$ is a positive voltage and $V_{GL}$ is a negative voltage. Further, $V_{GH}$ and $V_{GL}$ correspond to the turn-on and turn-off voltages of the transistors of the subpixels configured to control activation and deactivation of the subpixels 333. In one example embodiment, $V_{GH}$ is about 15 V and $V_{GL}$ is about −10 V. However, other voltages may be used. In one or more embodiments, each of the gate lines 331 may be coupled to a respective one of the rows of subpixels 333. In one or more embodiments, at least two gate lines 331 are coupled to different ones of the subpixel 333 of a common row.

The gate line signals may be controlled by gate selection circuitry 306. The gate selection circuitry 306 may include one more shift registers and may be coupled to the display circuitry 254 via communication path. The display circuitry 254 may provide one or more clock signals and a gate control signal to the gate selection circuitry 306, and the gate selection circuitry 306 may utilize the one or more clock signal to select and deselect gate lines for updating. The clock signals may also be, or alternatively, utilized to control display line update timing and/or display frame blanking timing. Further emission control signals may be generated by emission control circuitry 307. The emission control circuitry 307 may be controlled via one or more clock signals provided by the display circuitry 254 via the communication path 308. The emission control circuitry 307 may include one or more shift registers. Additionally, the emission control circuitry may be coupled to emission lines 334 and drive an emission control signal on the emission lines 334 to control a brightness level of the subpixels 333.

The gate selection circuitry 306 and/or the emission control circuitry maybe disposed along one or more edges of the display panel 305. For example, the gate selection circuitry may be disposed along a first edge and the emission control circuitry 307 may be disposed along a second edge of the display panel 305.

Each of the data lines 332 are coupled to a column of subpixels and are configured to drive a subpixel data signal onto each of the subpixels. For example, a subpixel 333 that has been selected for updating by selection circuitry 324 may be driven with a subpixel data signal by the display circuitry 254 via a corresponding one of the data lines 332. In one embodiment, the subpixel data signal is a voltage signal and charges a storage capacitor of the subpixel 333 to a predetermined voltage level corresponding to a brightness level.

Each of the data lines 332 may be simultaneously driven with a corresponding subpixel data signal to simultaneously update each selected (e.g., activated) subpixel along a selected gate electrode. The display circuitry 254 may include source drivers 255 that are each coupled to a respective one of data lines 332. The source drivers 255 may include one or more amplifiers and other drive circuitry configured to drive a corresponding voltage signal on to an activated subpixel. The drive circuitry may include one or more linear or non-linear digital to analog converters. In one or more embodiments, the display circuitry 254 may additionally include hardware and firmware elements configured to receive display data from a host device, and process the display data to generate the subpixel data signals. The subpixel data lines 332 may be driven on the data lines 332 to update the subpixels 333. For example, the display circuitry 254 may include a mobile industry processor interface (MIPI) receiver. Further, the display circuitry 254 may include timing control circuitry configured to generate timing signals used for updating the display panel 305. The timing signals may include selection circuitry clock signals.

In one embodiment, the period corresponding to when each subpixel coupled to a gate line 331 and/or in a common row is updated may be referred to a display line update period. Further, each row of subpixels may be referred to as a display line (e.g., selected by a gate electrode). The portion the display selected for updating may zig-zag or be coupled to alternate sides of a gate line 331 to cover various sub-pixel arrangements. One or more gate lines 331 may be utilized to select the portion of display for updating. Further, a column may be connected to a single data line 332 which may zig-zag over the display panel 305 or alternate sides of the data line 332 may provide connections to provide updates for a particular pattern of the subpixels 333.

In one embodiment, the display panel 305 includes more data lines 332 than gate lines 331. For example, a high definition display panel may include about 1080 gate lines and about 5760 data lines. The number of gate lines 331 and data lines 332 may correspond to the resolution and/or orientation of the display panel, the number of subpixels per pixel, any multiplexing of the data lines, and the orientation of subpixels within the display panel. In one or more embodiments, the gate lines 331 may be driven by a shift register and clocked with a reduced number of clock lines to reduce routing area and improve industrial design. Further, in one or more embodiments, the data lines 332 may be multiplexed (e.g. selected and deselected).

Figure 3D:
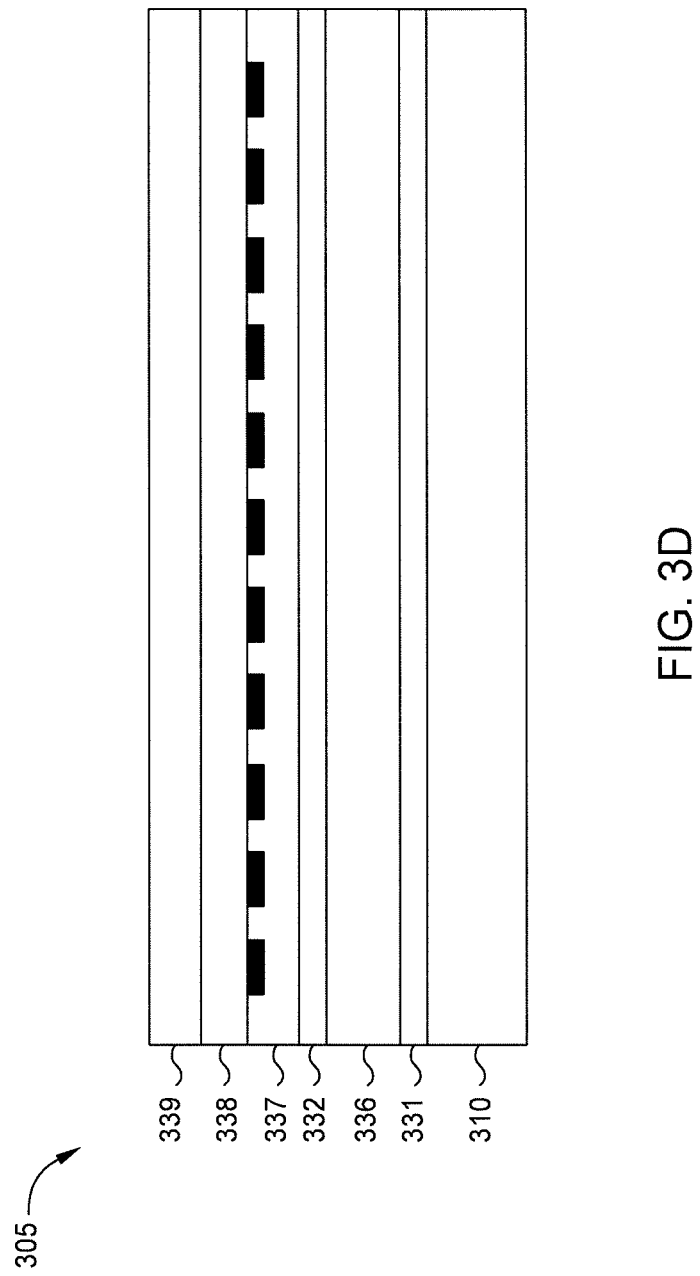

FIG. 3D is an example partial side view of the display panel 305. In the illustrated embodiment the display panel 305 includes substrate 310, the gate lines 331, the data lines 332, subpixel circuitry 336, anode electrodes 337, organic layers 338 and cathode electrode 339. In one embodiment, the gate lines 331 and data lines 332 may be disposed within different metal layers, and the position of those metal layers may differ from what is shown in FIG. 3D. For example, in different embodiments, gate lines 331 may be deposed in a metal layer either above or below the metal layer of data lines 332.

The substrate 310 may be a glass substrate or a plastic substrate. In one embodiment, the substrate 310 is substantially rigid. In other embodiments, substrate 310 is flexible. Further, a display panel may be manufactured and initially patterned and processed as a sheet on a rigid substrate before singulation and release for assembly into a display module via a flexible substrate 310.

The subpixel circuitry 336 comprises one or more transistors configured to control the activation and deactivation of each subpixel 333 and current flow through each subpixel 333 for updating of subpixel 333. The subpixel circuitry 336 for each subpixel is coupled to a corresponding gate line 331, data line 332 and anode electrode 337. Further, the subpixel circuitry 336 may be configured to control the flow of current onto a corresponding anode electrode 337 from a cathode through an OLED. In one embodiment, the subpixel circuitry 336 for a subpixel is configured to couple a corresponding anode electrode 337 with the subpixel data signal on a corresponding data line 332. For example, the subpixel circuitry controls the voltage across a storage capacitor of a corresponding subpixel, and the storage capacitor controls the transistor (e.g., drive) current of the subpixel circuitry. Further, the subpixel circuitry 336 for a subpixel may be configured to couple a corresponding anode electrode 337 with an initialization voltage before coupling a corresponding anode electrode 337 with the subpixel data signal. The subpixel circuitry 336 may be composed of one or more Thin Film Transistors (TFT). The TFTs may be formed of one or more of low temperature poly-silicon, oxide semiconductors, or amorphous silicon materials. Further, the subpixel circuitry 336 may include one or more emission control transistor(s) configured to isolate a corresponding OLED to prevent current flow during the subpixel update process. Updating the subpixels 333 may include charging of the corresponding storage capacitor and/or offset compensation. In one or more embodiments, isolation may be provided by the emission lines 334.

The cathode electrode 339 may be a sheet of resistive material configured to overlap one or more of the subpixels 333. In one embodiment, the display panel 305 includes a single cathode electrode 339 that is disposed over each of the subpixels 333. In one or more embodiment, the cathode electrode 339 is a resistive sheet having a resistance of about 1 to about 20 ohms per square. The cathode electrode 339 may be coupled with and driven by the display circuitry 254 to supply a low impedance reference voltage. In one embodiment the voltage across a sub-pixel and the current to the cathode electrode 339 from the anode electrode 337 corresponds to the amount of light that is emitted by each subpixel 333. The current may be controlled by a one or more field effect transistors (e.g., as a controlled current source) to minimize the effect of any variation in diode forward voltage, or resistive supply voltage drop in the display panel 305. Further, the cathode electrode 339 is electrically separated from the anode electrode 337 by one or more organic layers 338, forming the OLEDs.

In one embodiment, the display circuitry 254 utilizes an emission control signal to control the brightness, or control the dimming, of each subpixel 333. For example, the emission control signal may be a pulse width modulated (PWM) signal, and the brightness of each subpixel 333 may correspond to a duty cycle of the PWM signal. In one embodiment, the greater the duty cycle of the emission control signal, the brighter each of the subpixels 333 will be. For example, for an emission control signal having a duty cycle of 50%, the resulting brightness for each of the subpixels will be about 50% of the maximum brightness (e.g., for 100% duty cycle). In one embodiment, the emission control signal is driven onto each emission control line 335 coupled in a scanning fashion such that one or more rows of subpixels 333 are driven at a time with emission control signal. For example, the emission control signals may be driven by emission control circuitry by clocking the shift register or registers of the emission control signal with a clock signal to deselect display lines. Clocking the shift registers may be referred to as applying "walking ones" to the shift register or registers of the emission control circuitry. Further, deselecting the display lines with the emission control circuitry may stop current from flowing through the display line(s). Further, in various embodiments, a first emission control signal may be driven onto a first group of subpixels 333 via a corresponding first group of emission control lines 335 and a second emission control signal may be driven onto a second group of subpixels 333 via a corresponding second group of emission control lines 335. In other embodiments, more than two groups of consecutive subpixels of subpixels 333 and corresponding groups of consecutive emission control lines 335 may be utilized. For example, consecutive subpixels may be driven by a common shift register of the emission control circuitry clocked by the display circuitry 254 to increase the "flicker" frequency of the PWM. In one embodiment, the emission control lines may also be controlled using a small number of clock signals through a shift register to reduce on routing outside of the active area of the display device 300.

In one embodiment, the display circuitry 254 is configured to increase and/or decrease the brightness of the display panel by increasing and/or decreasing the duty cycle of the emission control signal. Further, by scanning the emission control signal across the display rows display artifacts may be reduced.

The display circuitry 254 is configured to update subpixels 333 to update an image displayed on the display panel 305 during display frames. The display frames may be updated, or refreshed, once about every 16 ms, generating a display refresh rate of 60 Hz. In other embodiments, other display refresh rates may be employed. For example, the display refresh rate may be 90 Hz, 120 Hz, 240 Hz, or greater. In one embodiment, each display frame includes one or more subframes.

The display circuitry 254 may generate timing signals such as a vertical sync (VSYNC) signal to start and/or end a display frame. In one embodiment, the VSYNC signal is provided to selection circuitry 324 to provide an indication to the selection circuitry 324 to begin selection of the gate lines 331 for display updating. In one embodiment, the VSYNC signal may additionally or alternatively identify one or more vertical blanking periods within a display frame. For example, the VSYNC signal may be utilized to reset one or more shift register of the selection circuitry.

The display circuitry 254 may additionally generate a timing signal such as a horizontal sync (HSYNC) signal that corresponds to the start of a display line update period and/or to an end of a display line update period. An end of a display line update period may correspond to a cycle of the gate selection circuitry control signals provided by the display circuitry 254. The display circuitry 254 may output HSYNC signal to selection circuitry 324 to control selection and deselection of gate lines 331. In one embodiment, the horizontal sync signal may additionally or alternatively identify one or more blanking periods that correspond to a display line update period.

In one embodiment, the display circuitry 254 utilizes a timing signal such as a display enable signal received from a host device that may be a composite signal of both the HSYNC and VSYNC signals, and may identify the start time of a display frame, an end time of a display frame, horizontal blanking periods corresponding to a display line update period, and/or vertical blanking periods within a display frame. In one embodiment, only a portion of the subpixels 333 may be updated during each display frame. For example, the portions of the subpixels 333 determined to have not changed from display frame to display frame may not be updated.

Figure 4:
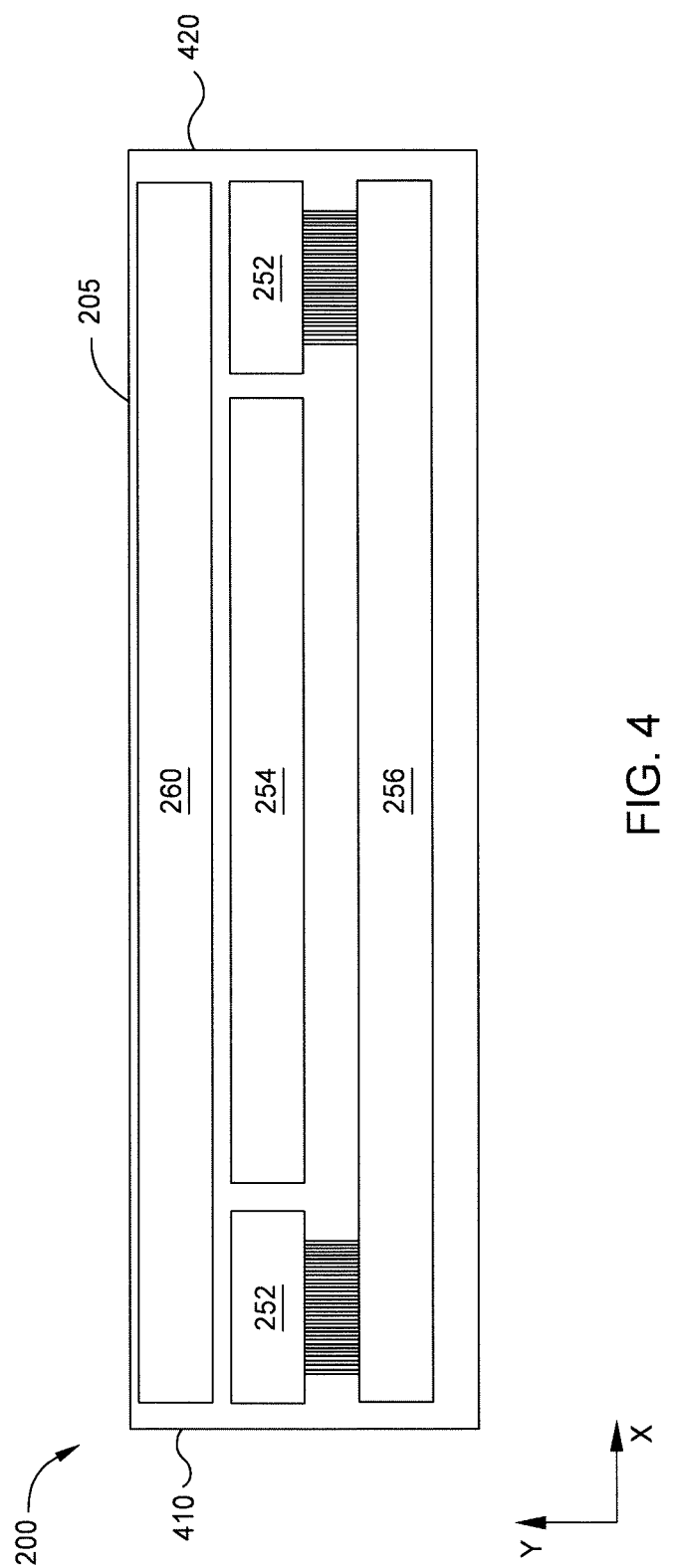
FIGS. 4-5 are schematic block diagrams of example semiconductor devices, according to one or more embodiments.

FIG. 4 illustrates partial schematic view of the semiconductor device 200, according to one or more embodiments. In the embodiment of FIG. 4, the semiconductor device 200 includes the sensor circuitry 252, the display circuitry 254, and the sensor bus 256. Further, in the embodiment of FIG. 4, the sensor circuitry 252, the display circuitry 254, and the sensor bus 256 are illustrated as being in a single layer for illustration purposes. For example, in various embodiments, e.g., as is illustrated in FIG. 2A, the sensor circuitry 252, the display circuitry 254, and the sensor bus 256 may be located within two or more layers of the semiconductor device 200.

The display circuitry 254 may be disposed between a first portion of the sensor circuitry 252 and a second portion of the sensor circuitry 252 in the X direction. For example, the first portion of the sensor circuitry 252 may be disposed proximate edge 410 of the semiconductor device 200 and the second portion of the sensor circuitry 252 may be disposed proximate edge 420 of the semiconductor device 200. In one embodiment, the first portion of the sensor circuitry 252 may include transmitter circuitry 257 and the second portion of the sensor circuitry 252 may include receiver circuitry 258. In another embodiment, the first portion of the sensor circuitry 252 may include receiver circuitry 258 and the second portion of the sensor circuitry 252 may include transmitter circuitry 257. Further, in one embodiment, the first portion of the sensor circuitry 252 includes both receiver circuitry 258 and transmitter circuitry 257 and/or the second portion of the sensor circuitry 252 includes both receiver circuitry 258 and/or transmitter circuitry 257. The transmitter circuitry 257 includes one or more transmitters, e.g., drivers, configured to drive a modulated signal, e.g., a sensing signal, on a sensor electrode. The receiver circuitry 258 includes one or more receivers configured to receive a resulting signal. The one or more receivers include one or more integrators, demodulators, sample-and-hold circuits, filters, etc. Further, the display circuitry 254 may include one or more source drivers, clock signal generators, etc.

In one or more embodiment, the sensor bus 256 couples pads 260 located at a first portion of the semiconductor device 200 with the sensor circuitry 252 located at a second portion of the semiconductor device 200. For example, the sensor bus 256 may couple a pad 260 located proximate edge 410 with the sensor circuitry located proximate edge 420. Further, the sensor bus 256 may couple a pad 260 located proximate edge 420 with the sensor circuitry located proximate edge 410.

Figure 5:
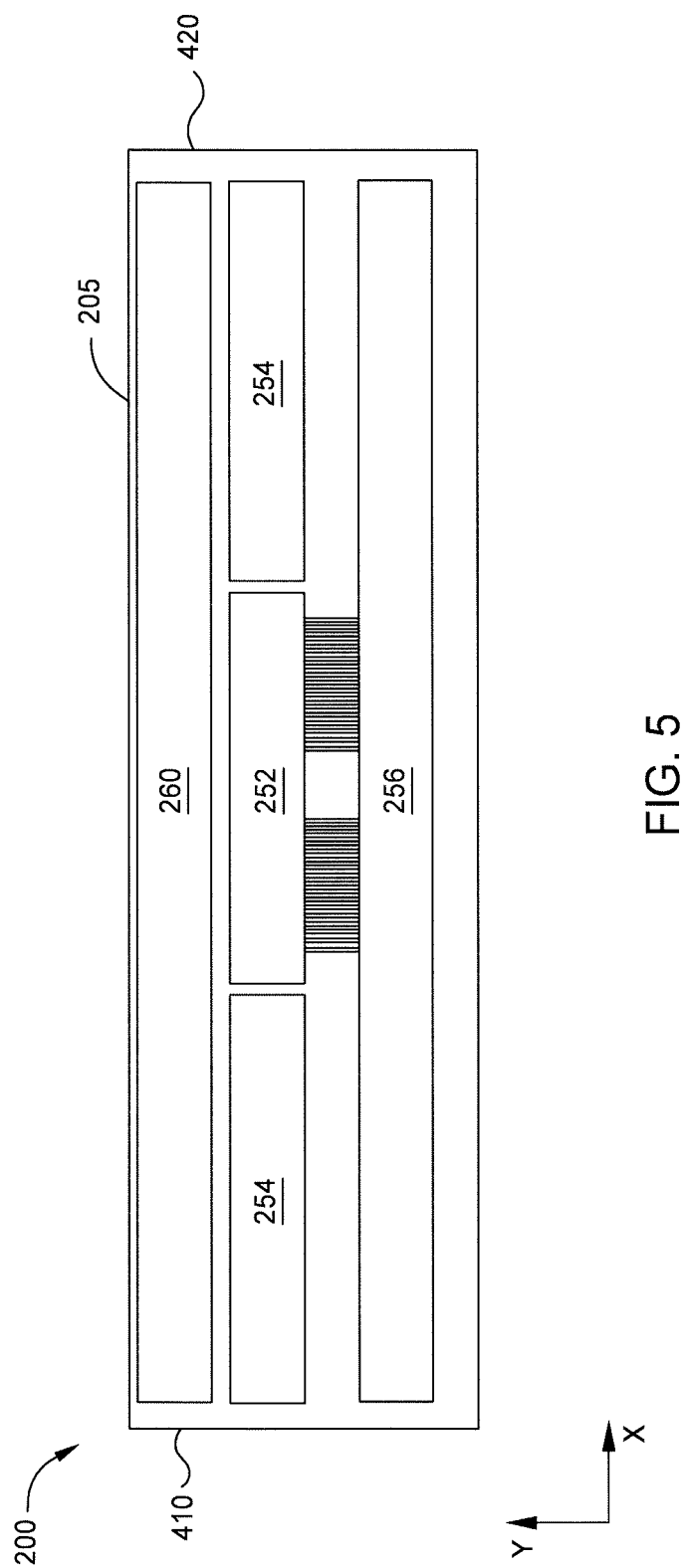

FIG. 5 illustrates a partial schematic top view of the semiconductor device 200, according to one or more embodiments. In one embodiment, semiconductor device 200 includes the sensor circuitry 252, the display circuitry 254, and the sensor bus 256. Further, the sensor circuitry 252, the display circuitry 254, and the sensor bus 256 are illustrated as being a single layer to for illustration purposes. For example, in various embodiments, e.g., as is illustrated in FIG. 2A, the sensor circuitry 252, the display circuitry 254, and the sensor bus 256 may be located within two or more layers of the semiconductor device 200.

In one or more embodiments, the sensor circuitry 252 is disposed between a first portion of the display circuitry 254 and a second portion of the display circuitry 254 in the X direction. For example, the first portion of the display circuitry 254 may be disposed proximate edge 410 of the semiconductor device 200 and the second portion of the display circuitry 254 may be disposed proximate edge 420 of the semiconductor device 200. The sensor circuitry 252 may include transmitter circuitry 257 and receiver circuitry 258.

In one or more embodiment, the sensor bus 256 couples pads 260 located at a first portion of the semiconductor device 200 with the sensor circuitry 252 located at a second portion of the semiconductor device 200. For example, the sensor bus 256 may couple a pad 260 located proximate edge 410 or edge 420 with the sensor circuitry located proximate the center of the semiconductor device 200.

Figure 6:
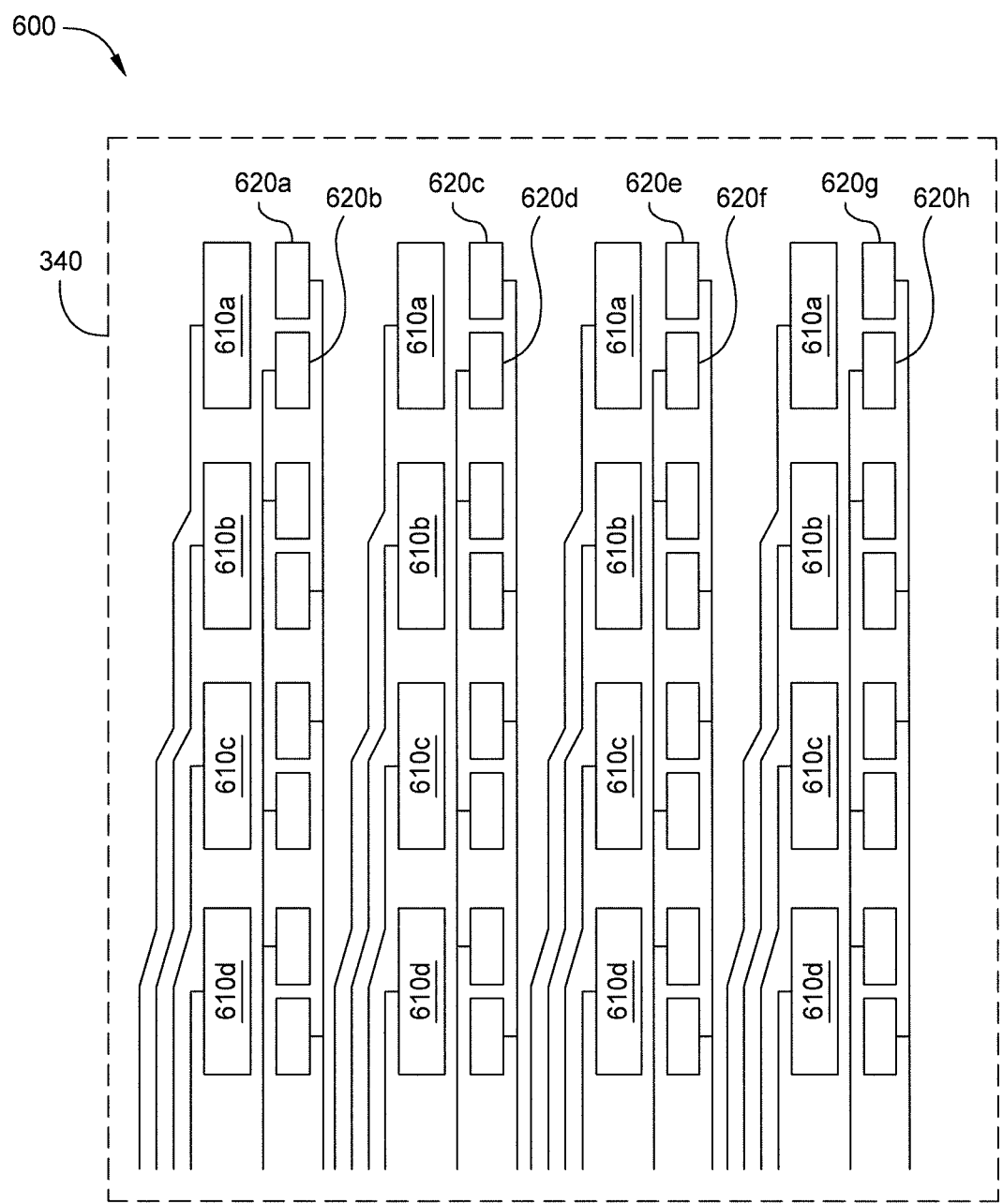
FIGS. 6-7 are schematic block diagrams of example sensor electrode layouts, according to one or more embodiments
Figure 7:
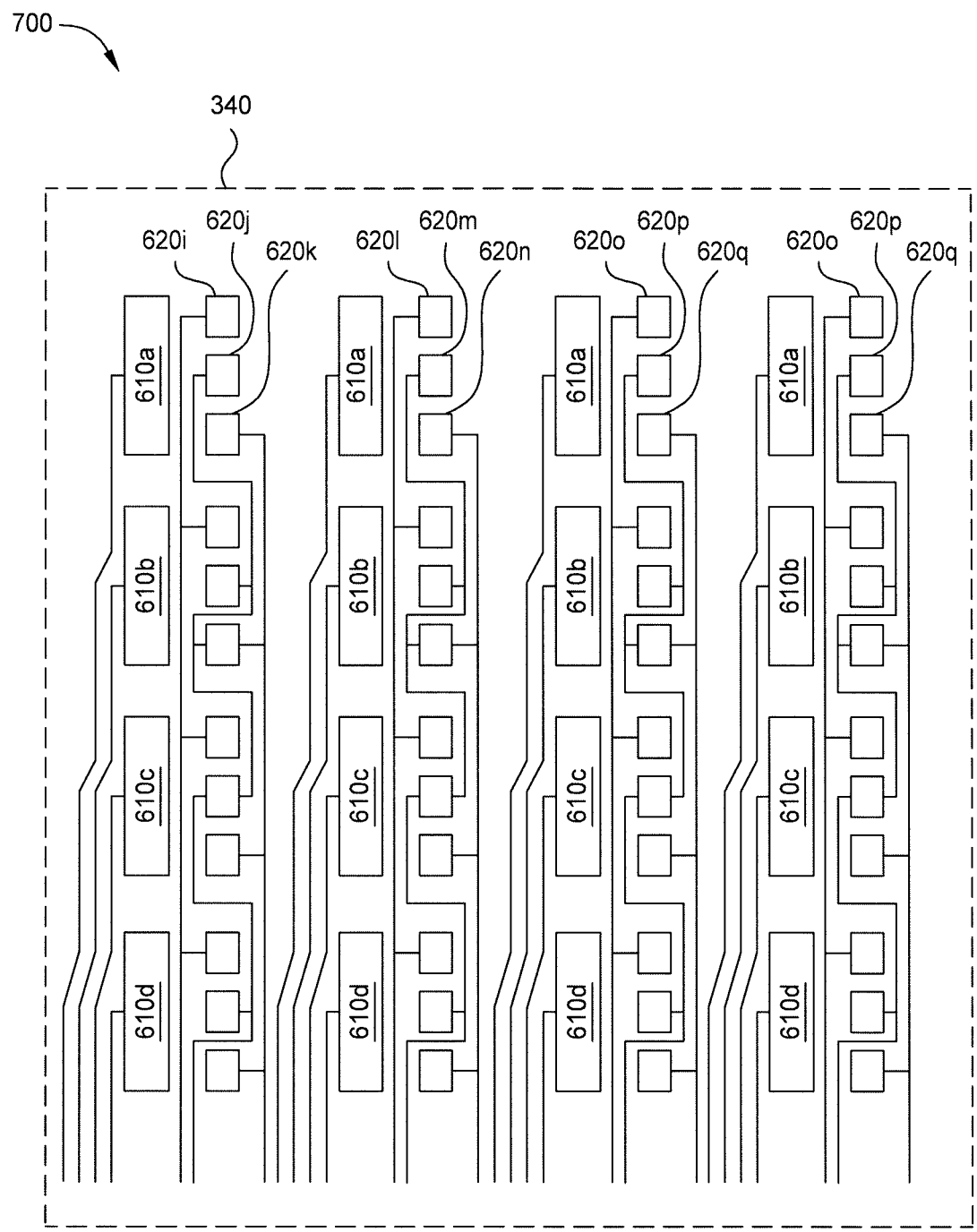

FIGS. 6 and 7 illustrate a sensor electrode layout 600 and 700, respectively, according to one or more embodiments. Further, the sensor electrodes 340 of sensor electrode layouts 600 and 700 include sensor electrodes 610 and sensor electrodes 620. In one or more embodiments, the sensor electrodes 610 and the sensor electrodes 620 may be disposed in a common layer. In other embodiments, the sensor electrodes 610 maybe disposed in first layer, and the sensor electrodes 620 may be deposed in a second layer.

The sensor electrodes 610, 620 may have any shape, size and/or orientation. For example, the sensor electrodes 610, 620 may be arranged in a two-dimensional array as illustrated in FIGS. 6 and 7. In one or more embodiments, each of the sensor electrodes 610, 620 may be substantially rectangular in shape. In other embodiments, the sensor electrodes 610, 620 may have other shapes. Further, each of the sensor electrodes 610 and/or each of the sensor electrodes 620 may have the same shape and/or size. In other embodiments, at least one sensor electrode 610 and/or the sensor electrodes 620 may have a shape and/or size different than another sensor electrode. In various embodiments, the sensor electrodes 610, 620 may be diamond shaped, have interdigitated fingers to increase field coupling, and/or have floating cut-outs inside to reduce stray capacitance to nearby electrical conductors.

Figure 8A:
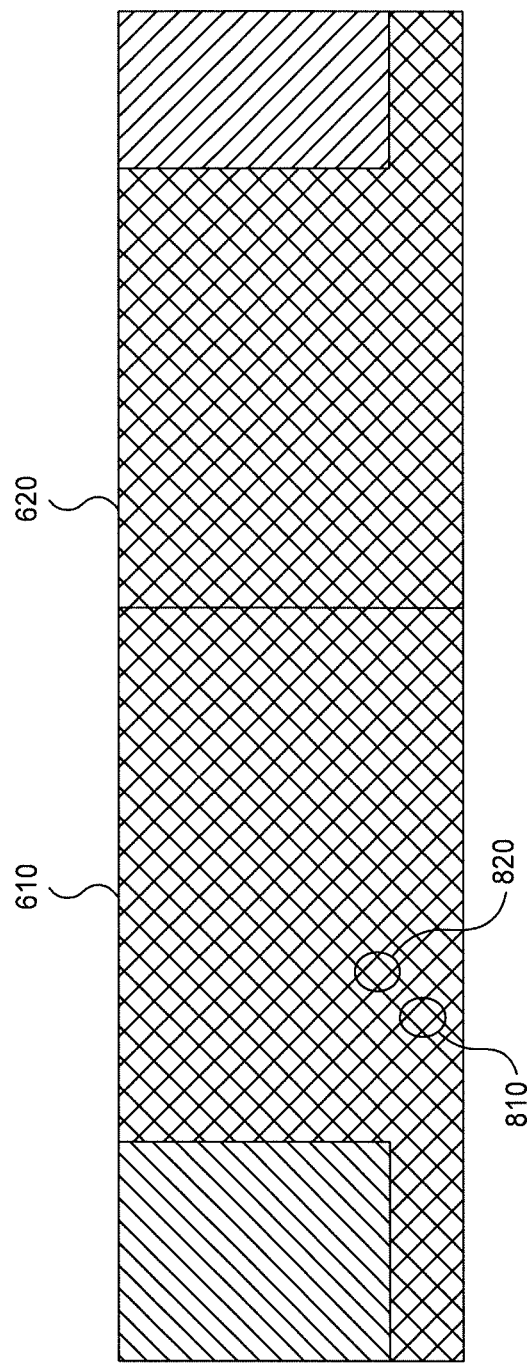
FIG. 8A illustrates a portion of sensor electrodes, according to one or more embodiments.

The sensor electrodes 610, 620 may be formed from a material or a configuration that is at least substantially transparent material. For example, the sensor electrodes 610, 620 may be formed from indium tin oxide (ITO), thin conductive wires, and wire mesh. For example, as illustrated in FIG. 8, the sensor electrodes 610 and 620 are formed from metal mesh. Further, in the embodiment of FIG. 8A, the pattern of the metal mesh used to form the sensor electrodes 610 and 620 is aligned with the boundaries of the subpixels 333 of the display device 300. For example, the distance between the conductive wires making up the metal mesh may vary to ensure that the wires of the metal mesh pattern do not overlap the subpixels 333 of the display device 300. In one embodiment, the distance between wires of the metal mesh within region 820 is less than the distance between wires of the metal mesh with region 810, such that the subpixels 333 are not overlapped by the wires of the metal mesh pattern. FIG. 8B is a schematic cross-sectional view of a portion of the display panel 305, according to one or more embodiments. As illustrated in FIG. 8B, the sensor electrode 610a, 620 does not overlap the viewing angle subpixel 333. In one embodiment, the gap between lines of the wire mesh forming the sensor electrodes 610, 620 are configured such that the wires do not overlap the subpixel 333.

The sensor circuitry 252 may be configured to operate the sensor electrodes 610 and the sensor electrodes 620 to acquire sensor data. For example, the sensor circuitry may drive one or more of the sensor electrodes 610 with a sensing signal while receiving resulting signals from one or more of sensor electrodes 620. Alternatively, the sensor circuitry may drive one or more of the sensor electrodes 620 with a sensing signal while receiving resulting signals from one or more of sensor electrodes 610. Further, the sensor circuitry 252 may drive one or more of the sensor electrodes 610, 620 with a sensing signal while receiving resulting signals from the driven sensor electrode or electrodes. The sensing signals may include transcapacitive sensing signals for transcapacitive sensing and absolute capacitive sensing signals for absolute capacitive sensing. In one embodiment, the sensor circuitry 252 is configured to operate the sensor electrodes 610, 620 for absolute capacitive sensing by driving one or more of the sensor electrodes 610, 620 with absolute capacitive sensing signals while receiving resulting signals with the driven sensor electrodes. Further, the sensor circuitry 252 is configured to operate the sensor electrodes 610, 620 for transcapacitive sensing by driving one or more of the sensor electrodes 610, 620 with a transcapacitive signal and receiving resulting signal from the other one or more of the sensor electrodes 610, 620. In one embodiment, one or more transmitters of the transmitter circuitry 257 drives one or more of the sensor electrodes 610, 620 with a transcapacitive signal while one or more receivers of the receivers circuitry 258 receives resulting signals with a second one or more of the sensor electrodes 610, 620. The sensor electrodes 610, 620 driven with the transcapacitive signal may be referred to as a transmitter electrode and the sensor electrodes 610, 620 operated to receive resulting signals may be referred to as receiver electrodes. In one embodiment, receiving the resulting signals may comprise sampling the resulting signals to generate one or more samples.

In one embodiment, the sensing signals may be a varying voltage signal that varies between at least two voltages. In one embodiment, the sensing signal includes a plurality of sensing bursts. Each sensing bursts may include a plurality of voltage transitions. In one or more embodiments, the sensor circuitry 252 may maintain the receiver electrodes at a substantially constant voltage (e.g., relative to system ground) or modulate the receiver electrodes relative to the transmitter electrodes. In one embodiment, when the receiver electrodes are modulated (e.g., relative to system ground), the transmitter electrodes are modulated relative to the receiver electrodes, such that the transmitter electrodes are modulated at a different phase, polarity, amplitude, and/or frequency than the receiver electrodes. The sensor circuitry 252 receives resulting signals with the receiver electrodes and the determination module 390 measures the resulting signals to determine a measurement of the change in capacitive coupling between the receiver electrodes and the transmitter electrodes.

The sensor circuitry 252 may be configured to drive each of the transmitter electrodes one at a time, or simultaneously drive at least two of the transmitter electrodes. In one embodiment, the sensor circuitry 252 is configured to simultaneously drive at least two transmitter electrodes with different transcapacitive sensing signals based on different codes or frequencies. For example, multiple transmitter electrodes may be simultaneously driven with transcapacitive sensing signals which are modulated with substantially orthogonal coded sequences (e.g., amplitude shifted, phase shifted, frequency shifted). The corresponding resulting signals may be decoded to independently measure the coupling of between the transmitter electrodes and the receiver electrodes.

In the embodiment of FIGS. 6 and 7 each of the sensor electrodes 610 in a common row, e.g., the sensor electrodes 610a, the sensor electrodes 610b, the sensor electrodes 610c, and/or the sensor electrodes 610d, may be simultaneously driven with a sensing signal. In one embodiment, each of the sensor electrodes in a common row may be driven by a common transmitter, reducing the number of transmitters required within sensor circuitry 252. For example, each of the sensor electrodes 610a may be coupled to a first transmitter of transmitter circuitry 257, each of the sensor electrodes 610b may be coupled to a second transmitter of transmitter circuitry 257, each of the sensor electrodes 610c may be coupled to a third transmitter of transmitter circuitry 257, and each of the sensor electrodes 610d may be coupled to a fourth transmitter of transmitter circuitry 257.

Further, with reference to FIG. 6, each of the sensor electrodes 620a-620h are coupled to a different receiver of receiver circuitry 258. With reference to FIG. 7, each of the sensor electrodes 620i-620q is coupled to a different receiver of receivers of receiver circuitry 258.

Figure 9:
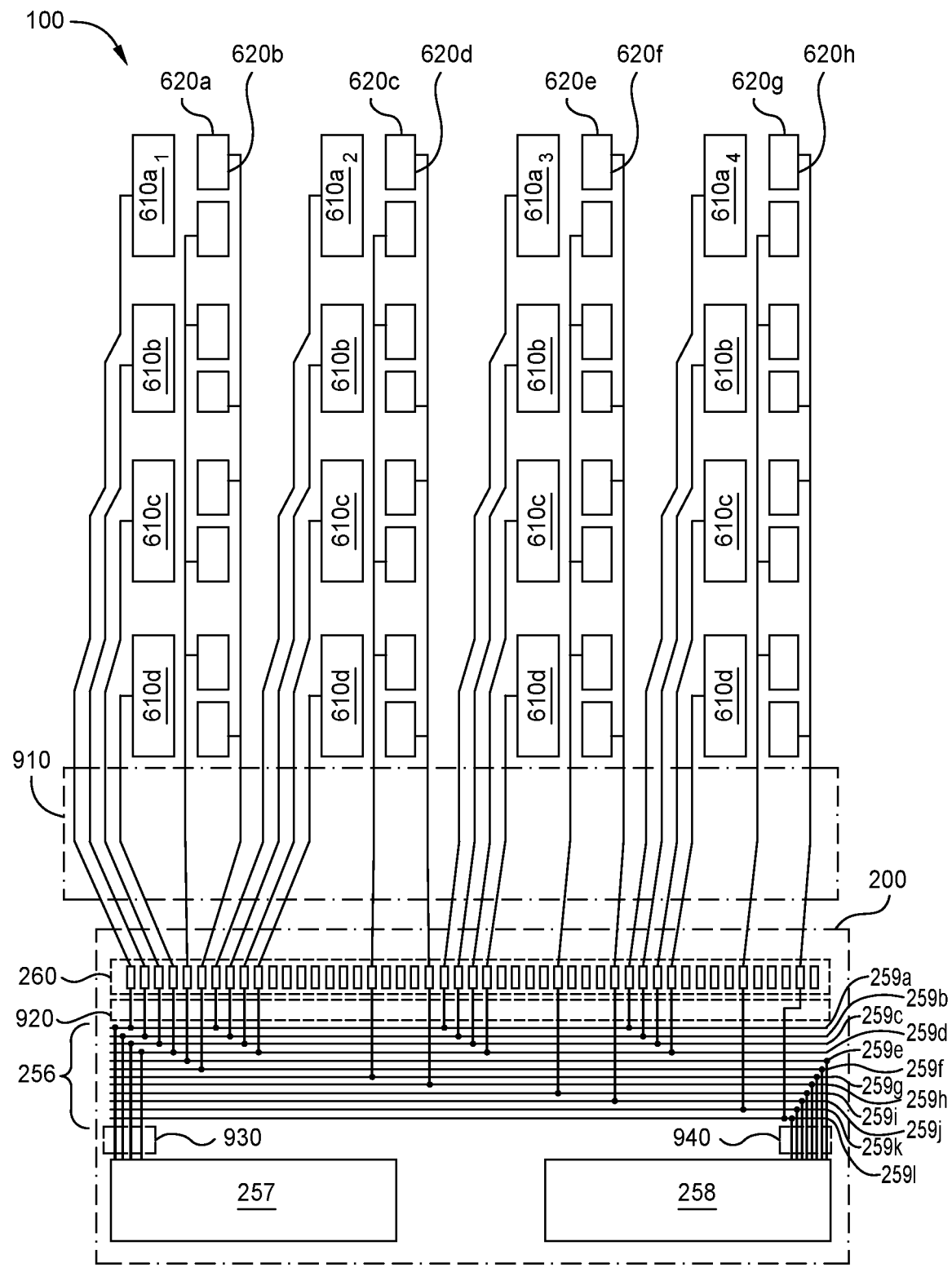
FIG. 9 is a schematic block diagram of an example input device, according to one or more embodiments.
Figure 10:
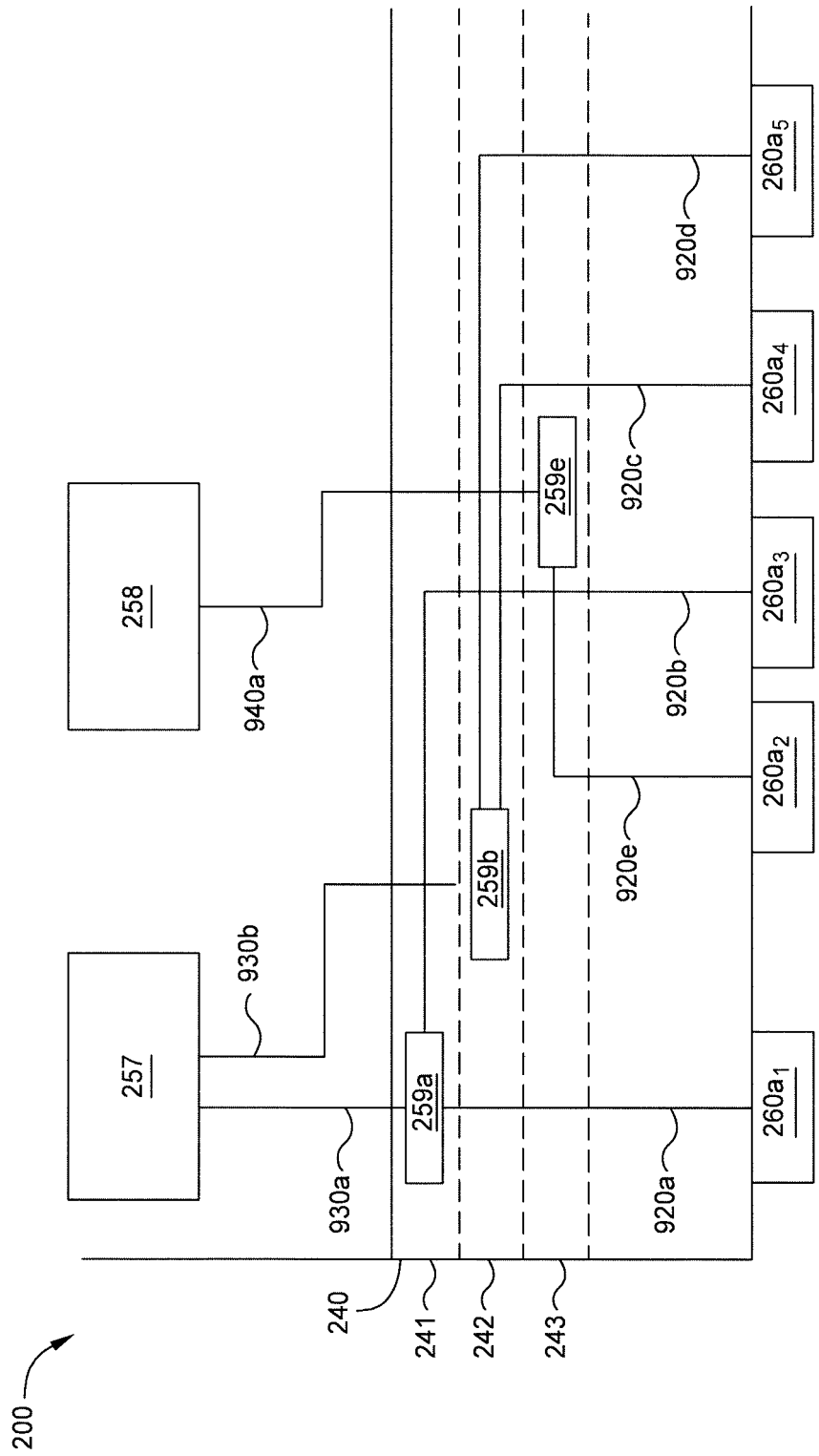
FIG. 10 is a cross-sectional view of a portion of an example semiconductor device, according to one or more embodiments.

FIG. 9 illustrates a schematic diagram of the input device 100, according to one or more embodiments. The elements of FIG. 9 are illustrated as being in a single layer for ease of description; however, one or more of the elements may be found on a layer different from another one or more of the elements, as illustrated in FIGS. 2A and 10. The input device 100 of FIG. 9 includes sensor electrodes 610, 620, traces 910, and semiconductor device 200. The traces 910 couple the sensor electrodes 610, 620 with the pads 520 of the semiconductor device 200. In one embodiment, the traces 910 are coupled with the pads 360 of substrate 310 which are coupled with the pads 260. Further, the pads 260 are coupled via traces 920 to the sensor bus 256 and the sensor bus 256 is coupled via traces 930 to transmitter circuitry 257 and via traces 940 to receiver circuitry 258.

In one embodiment, each of the sensor electrodes 610, 620 is coupled to a different one of the pads 260. Further, each of the pads 260 is coupled to one of the communication wires 259 of the sensor bus 256. In one embodiment, two or more of the pads 260 are coupled to a common communication wire 259, such that two or more of the sensor electrodes 610 are coupled to a common transmitter of transmitter circuitry 257 and may be driven simultaneously. For example, each of the sensor electrodes 610a is coupled to the communication wire 259a, each of the sensor electrodes 620b is coupled to the communication wire 259b, each of the third sensor electrodes 620c is coupled to the communication wire 259c, and each of the fourth sensor electrodes 620d is coupled to the communication wire 259d. Further, the communication wires 259a-259d are coupled to the transmitters 257.

In one or more embodiments, two or more of the pads 260 are coupled to different communication wires, such that two or more of the sensor electrodes 620 are coupled to a different receiver of the receiver circuitry 258 and may be received with independently. For example, the sensor electrode 620a is coupled to the communication wire 259e, the sensor electrode 620b is coupled to the communication wire 259f, the sensor electrode 620c is coupled to the communication wire 259g, the sensor electrode 620d is coupled to the communication wire 259h, the sensor electrode 620e is coupled to the communication wire 259i, the sensor electrode 620f is coupled to the communication wire 259j, the sensor electrode 620g is coupled to the communication wire 259k, and the sensor electrode 620h is coupled to the communication wire 259l. In one or more embodiments, the communication wires 259e-259l may each be coupled to a different receiver of the receiver circuitry 258. Alternatively, two or more of the communication wires 259e-259l may be coupled to a common receiver of the receiver circuitry 258 via a switching device (e.g., a multiplexer or the like).

FIG. 10 illustrates is a cross-section of a schematic view of a portion the semiconductor device 200. In one or more embodiments, the communication wires 259 may be disposed in different layers of the interconnect layer 240. Further, the traces 920 and 930 may act as interconnects travelling between the layers, coupling the traces 920 and 903 with respective ones of the pads 260a. In one embodiment, the communication wire 259a is disposed in a first layer 241 of the interconnect layer 240, the communication wire 259b is disposed in a second layer 242 of the interconnect layer 240, and the communication wire 259e is disposed in a third layer 243 of the interconnect layer 240. Alternatively, one or more of the communications wires 259 may be disposed in a common layer of the interconnect layer 240.

In one embodiment, the communication wire 259a is coupled to the pad $260a_1$ via the trace 920a and to the pad $260a_3$ via the trace 920b. Further, the communication wire 259a is coupled to the transmitter circuitry 257 via the trace 930a. Additionally, the communication wire 259b is coupled to the pad $260a_4$ via the trace 920c and to the pad $260a_5$ via the trace 920d. Further, the communication wire 259b is coupled to the transmitter circuitry 257 via the trace 930b. Moreover, the communication wire 259e is coupled to the pad $260a_2$ via the trace 920e and the communication wire 259e is coupled to the receiver circuitry 258 via the trace 940a.

Figure 11:
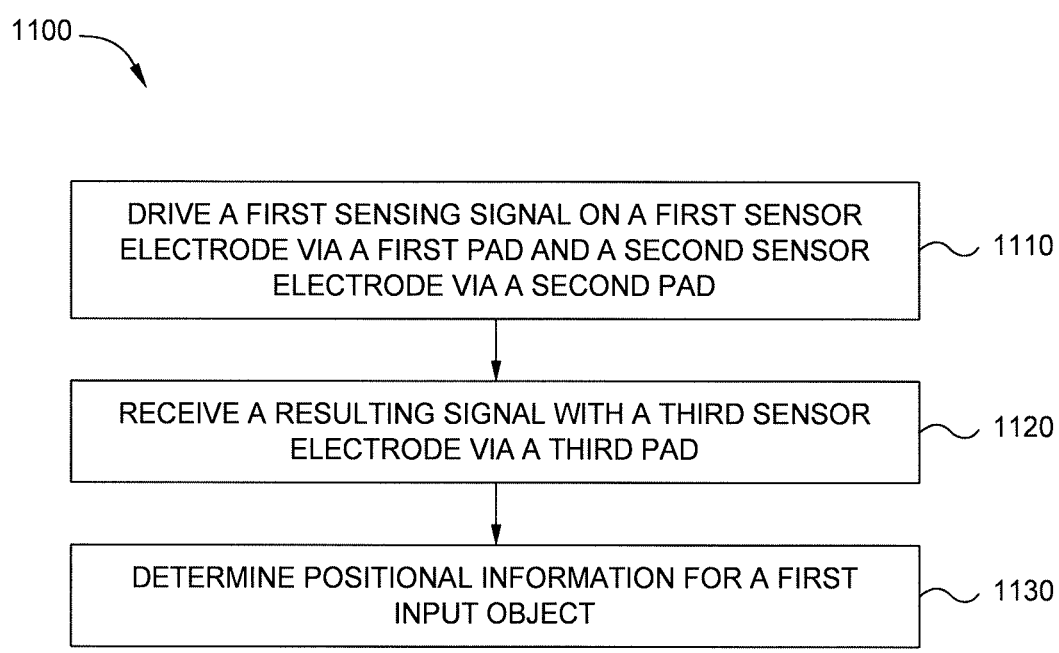
FIG. 11 is a flow diagram of a method for capacitive sensing, according to one or more embodiments.

FIG. 11 illustrates a flow chart of a method 1100 for operating a capacitive sensing device, according to one or more embodiments. At operation 1110, a first sensing signal is driven on a sensor electrode via a first pad and a sensor electrode via a second pad. For example, a first transmitter of transmitter circuitry 257 may drive the sensor electrode $610a_1$ with a transcapacitive signal via pad $260a_1$ and the sensor electrode $610a_2$ with a transcapacitive signal via pad $260a_2$. The pad $260a_1$ and the pad $260a_3$ are coupled to a common communication wire 259a of the sensor bus 256. Further, in one or more embodiments, the communication wire 259a is coupled to a first transmitter of the transmitter circuitry 257 via trace 930a. At operation 1120, a resulting signal is received with a third sensor electrode via a third pad. For example, in one embodiment, a first receiver of receiver circuitry 258 receives a resulting signal with the sensor electrode 620a via the pad 260$a_2$. The pad 260$a_2$ is coupled to a second wire, e.g., the communication wire 259e, of the sensor bus 256. Further, in one or more embodiments, the communication wire 259e is coupled to the first receiver of the receiver circuitry 258 via trace 940a.

At operation 1130, positional information for a first input object is determined. For example, in one or more embodiments, the processing system 110 includes the determination module 390. The determination module 390 receives the resulting signal or a processed resulting signal from the receiver circuitry 258 and determines a measurement of a change in capacitive coupling between the sensor electrodes 610$a_1$, 610$a_2$ and the sensor electrode 620a. In one embodiment, the determination module 390 removes a baseline from the measurement of the change in capacitive coupling, applies one or more filters to the measurement of the change in capacitive coupling, and compares the measurement of the change in capacitive coupling to one or more thresholds to determine the positional information. In one embodiment, the determination module 390 is further configured to determine a capacitive image from the measurement of the change in capacitive coupling and determine the positional information from the capacitive image.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

What is claimed is:

1. A semiconductor device comprising:
   a die body comprising:
      sensor circuitry configured to operate a plurality of sensor electrodes for capacitive sensing, wherein the plurality of sensor electrodes are disposed on a substrate external to the semiconductor device;
      a plurality of pads, wherein a first pad of the plurality of pads is configured to be coupled to a first sensor electrode of the plurality of sensor electrodes, a second pad of the plurality of pads is configured to be coupled to a second sensor electrode of the plurality of sensor electrodes, and a third pad of the plurality of pads is configured to be coupled to a third sensor electrode of the plurality of sensor electrodes; and
      a sensor bus comprising a plurality of wires, wherein a first wire of the plurality of wires couples the first pad and the second pad to a first transmitter of the sensor circuitry and a second wire of the plurality of wires couples the third pad to a first receiver of the sensor circuitry.

2. The semiconductor device of claim 1 further comprises a first interconnect layer, and wherein the sensor bus is disposed within the first interconnect layer.

3. The semiconductor device of claim 2, wherein the first interconnect layer is a redistribution layer.

4. The semiconductor device of claim 2, wherein the sensor bus is partially disposed within the first interconnect layer and a second interconnect layer.

5. The semiconductor device of claim 1, further comprises a back-end-of-the-line (BEOL) portion, and wherein the BEOL portion comprises the sensor bus.

6. The semiconductor device of claim 1, wherein a fourth pad of the plurality of pads is configured to be coupled to a fourth electrode of the plurality of sensor electrodes, wherein the first wire further couples the fourth pad to the first transmitter or a third wire of the plurality of wires couples the fourth pad to a second transmitter of the sensor circuitry.

7. The semiconductor device of claim 6, wherein a fifth pad of the plurality of pads is configured to be coupled to a fifth electrode of the plurality of sensor electrodes, and wherein the third wire couples the fifth pad to the second transmitter.

8. The semiconductor device of claim 1, wherein the first transmitter is disposed at a first portion of the die body and the first receiver is disposed at a second portion of the die body, the first portion differs from the second portion.

9. An input device comprising:
   a plurality of sensor electrodes; and
   a semiconductor device comprising:
      sensor circuitry configured to operate the plurality of sensor electrodes for capacitive sensing, wherein the plurality of sensor electrodes are disposed on a substrate external to the semiconductor device;
      a plurality of pads, wherein a first pad of the plurality of pads is configured to be coupled to a first sensor electrode of the plurality of sensor electrodes, a second pad of the plurality of pads is configured to be coupled to a second sensor electrode of the plurality of sensor electrodes, and a third pad of the plurality of pads is configured to be coupled to a third sensor electrode of the plurality of sensor electrodes; and
      a sensor bus comprising a plurality of wires, wherein a first wire of the plurality of wires couples the first pad and the second pad to a first transmitter of the sensor circuitry and a second wire of the plurality of wires couples the third pad to a first receiver of the sensor circuitry.

10. The input device of claim 9, wherein the semiconductor device further comprises an interconnect layer, and wherein the sensor bus is disposed within the interconnect layer.

11. The input device of claim 9, wherein a fourth pad of the plurality of pads is configured to be coupled to a fourth electrode of the plurality of sensor electrodes.

12. The input device of claim 11, wherein the first wire further couples the fourth pad to the first transmitter.

13. The input device of claim 11, wherein a third wire of the plurality of wires couples the fourth pad to a second transmitter of the sensor circuitry, and wherein a fifth pad of the plurality of pads is configured to be coupled to a fifth electrode of the plurality of sensor electrodes, and wherein the third wire couples the fifth pad to the second transmitter.

14. The input device of claim 9 further comprising a display device, and wherein the substrate is disposed within the display device.

15. The input device of claim 9, wherein the plurality of sensor electrodes are disposed in a common layer.

16. The input device of claim 9, wherein the first sensor electrode is disposed in a first column of the plurality of sensor electrodes and the second sensor electrode is disposed in a second column of the plurality of sensor electrodes.

17. The input device of claim 16, wherein the first sensor electrode of the plurality of sensor electrodes and the second sensor electrode is disposed in a common row of the plurality of sensor electrodes.

18. A method for capacitive sensing comprising:
driving, with a first transmitter of a semiconductor device, a first sensor electrode and a second sensor electrode with a first transmitter signal, wherein the first sensor electrode is coupled to a first pad of the semiconductor device and the second sensor electrode is coupled to a second pad of the semiconductor device, and wherein the first pad and the second pad are coupled to a first wire of a sensor bus of the semiconductor device and the first wire is coupled to the first transmitter;
receiving, with a first receiver of the semiconductor device, a first resulting signal with a third sensor electrode coupled to a third pad of the semiconductor device, wherein the third pad is coupled to a second wire of the sensor bus, and the second wire is coupled to the first receiver, wherein the first sensor electrode, the second sensor electrode, and the third sensor electrode are disposed on a substrate external to the semiconductor device; and
determining positional information for an input object based on a measurement of a change in capacitive coupling between at least one of the first sensor electrode and the second sensor electrode and the third sensor electrode.

19. The method of claim 18 further comprising:
driving, with a second transmitter, a fourth sensor electrode and a fifth sensor electrode with a second transmitter signal, wherein the fourth sensor electrode is coupled to a fourth pad of the semiconductor device and the fifth sensor electrode is coupled to a fifth pad of the semiconductor device, and wherein the fourth pad and the fifth pad are coupled to a third wire of the sensor bus and the third wire is coupled to the second transmitter.

20. The method of claim 18 further comprising:
receiving, with a second receiver, a second resulting signal with a sixth sensor electrode, wherein the sixth sensor electrode is coupled to a sixth pad of the semiconductor device, the sixth pad is coupled to a fourth wire of the sensor bus, and the fourth wire is coupled to the second receiver.

21. The method of claim 18 further comprising:
driving, with the first transmitter, a fourth sensor electrode and a fifth sensor electrode with the first transmitter signal, wherein the fourth sensor electrode is coupled to a fourth pad of the semiconductor device and the fifth sensor electrode is coupled to a fifth pad of the semiconductor device, and wherein the fourth pad and the fifth pad are coupled to the first wire.

* * * * *